United States Patent
Engbrecht et al.

(10) Patent No.: US 9,269,607 B2
(45) Date of Patent: Feb. 23, 2016

(54) WAFER STRESS CONTROL WITH BACKSIDE PATTERNING

(71) Applicant: GLOBALFOUNDRIES Inc., Grand Cayman (KY)

(72) Inventors: Edward Engbrecht, Hopewell Junction, NY (US); Donghun Kang, Hopewell Junction, NY (US); Rishikesh Krishnan, Poughkeepsie, NY (US); Oh-jung Kwon, Hopewell Junction, NY (US); Karen A. Nummy, Newburgh, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/306,598

(22) Filed: Jun. 17, 2014

(65) Prior Publication Data

US 2015/0364362 A1 Dec. 17, 2015

(51) Int. Cl.
| | |
|---|---|
| *H01L 21/30* | (2006.01) |
| *H01L 21/762* | (2006.01) |
| *H01L 21/308* | (2006.01) |
| *H01L 21/321* | (2006.01) |
| *H01L 29/06* | (2006.01) |
| *H01L 21/66* | (2006.01) |

(52) U.S. Cl.
CPC ........ *H01L 21/76227* (2013.01); *H01L 21/308* (2013.01); *H01L 21/3212* (2013.01); *H01L 22/12* (2013.01); *H01L 29/0603* (2013.01)

(58) Field of Classification Search
CPC ............ H01L 21/76227; H01L 21/308; H01L 21/3212
See application file for complete search history.

(56) References Cited

U.S. PATENT DOCUMENTS

| | | | |
|---|---|---|---|
| 4,534,804 A | 8/1985 | Cade | |
| 5,943,597 A | 8/1999 | Kleffner et al. | |
| 6,441,396 B1 | 8/2002 | Adams et al. | |
| 6,573,156 B1 | 6/2003 | Wang et al. | |
| 7,355,273 B2 | 4/2008 | Jackson et al. | |
| 7,531,407 B2 | 5/2009 | Clevenger et al. | |
| 8,174,124 B2 | 5/2012 | Chiu et al. | |
| 8,202,800 B2 | 6/2012 | Chen et al. | |
| 8,413,324 B2 | 4/2013 | Noda et al. | |
| 8,587,121 B2 | 11/2013 | Koester et al. | |
| 2010/0218816 A1* | 9/2010 | Guha | H01L 31/0682 136/256 |
| 2010/0258882 A1* | 10/2010 | Magnee | B81C 1/00246 257/415 |
| 2012/0187530 A1* | 7/2012 | Zhang | H01L 23/645 257/531 |

* cited by examiner

*Primary Examiner* — Wael Fahmy
*Assistant Examiner* — Sarah Salerno
(74) *Attorney, Agent, or Firm* — Heslin Rothenberg Farley & Mesiti P.C.

(57) ABSTRACT

Embodiments of the present invention provide structures and methods for controlling stress in semiconductor wafers during fabrication. Features such as deep trenches (DTs) used in circuit elements such as trench capacitors impart stress on a wafer that is proportional to the surface area of the DTs. In embodiments, a corresponding pattern of dummy (non-functional) DTs is formed on the back side of the wafer to counteract the electrically functional DTs formed on the front side of a wafer. In some embodiments, the corresponding pattern on the back side is a mirror pattern that matches the functional (front side) pattern in size, placement, and number. By creating the minor pattern on both sides of the wafer, the stresses on the front and back of the wafer are in balance. This helps reduce topography issues such as warping that can cause problems during wafer fabrication.

7 Claims, 11 Drawing Sheets

WAFER STRESS CONTROL WITH BACKSIDE PATTERNING

FIELD OF THE INVENTION

The present invention relates generally to semiconductor fabrication, and more particularly, to methods and structures for controlling wafer stress.

BACKGROUND OF THE INVENTION

A problem area in IC chip manufacturing is achieving the dwindling feature sizes necessary to accomplish greater device densities. The meaning of the term "devices" here comprises all the desirable electrical circuit elements to which those skilled in the integrated circuit arts seek to achieve on their chips. For example, active elements like transistors and diodes, passive elements such as capacitors and resistors, or the substrates, metal wires and insulators used to connect the above into circuits. As lithography advances allow device features to shrink their dimensions horizontally, control of the feature positions and vertical dimensions becomes increasingly difficult and important. As critical dimensions continue to decrease, issues such as topography and overlay errors become more significant in determining product yield. It is therefore desirable to have methods and structures for mitigating issues caused by topography variation and overlay errors.

SUMMARY OF THE INVENTION

In a first aspect, embodiments of the present invention provide a method of forming a semiconductor structure, comprising: depositing a pad layer to a front side and a back side of a semiconductor substrate; forming a plurality of back side deep trenches on the back side of the semiconductor substrate to form a back side deep trench pattern; recessing the plurality of back side deep trenches; removing the pad layer from the back side of the semiconductor substrate; depositing a polysilicon layer on the back side of the semiconductor substrate and covering the plurality of back side deep trenches; and forming a plurality of front side deep trenches on the front side of the semiconductor substrate to form a front side deep trench pattern, wherein the front side deep trench pattern is a mirror of the back side deep trench pattern.

In a second aspect, embodiments of the present invention provide a method of forming a semiconductor structure, comprising: depositing a pad layer to a front side and a back side of a semiconductor substrate; computing a total surface area for a front side deep trench pattern; generating a back side deep trench pattern having an approximate equivalent surface area as the front side deep trench pattern; forming a plurality of back side deep trenches on the back side of the semiconductor substrate to form the back side deep trench pattern in the semiconductor substrate; recessing the plurality of back side deep trenches to a level below the back side of the semiconductor substrate; removing the pad layer from the back side of the semiconductor substrate; depositing a polysilicon layer on the back side of the semiconductor substrate and covering the plurality of back side deep trenches; and forming a plurality of front side deep trenches on the front side of the semiconductor substrate to form the front side deep trench pattern in the semiconductor substrate.

In a third aspect, embodiments of the present invention provide a semiconductor structure comprising: a semiconductor substrate; a plurality of front side deep trenches disposed in an upper region of the semiconductor substrate; and a plurality of back side deep trenches disposed in a lower region of the semiconductor substrate, wherein the plurality of back side deep trenches are covered with a layer of polysilicon.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

DETAILED DESCRIPTION

Embodiments of the present invention provide structures and methods for controlling stress in semiconductor wafers during fabrication. Features such as deep trenches (DTs) used in circuit elements such as trench capacitors impart stress on a wafer that is proportional to the surface area of the DTs. In embodiments, a corresponding pattern of dummy (non-functional) DTs is formed on the back side of the wafer to counteract the electrically functional DTs formed on the front side of a wafer. In some embodiments, the corresponding pattern on the back side is a mirror pattern that matches the functional (front side) pattern in size, placement, and number. By creating the mirror pattern on both sides of the wafer, the stresses on the front and back of the wafer are in balance. This helps reduce topography issues such as warping that can cause problems during wafer fabrication, especially with planarization processes. Additionally, warping can contribute to overlay errors. Both topography issues and overlay errors can adversely affect yield. Embodiments of the present invention can serve to mitigate these issues, thereby improving product yield.

Figure 1:
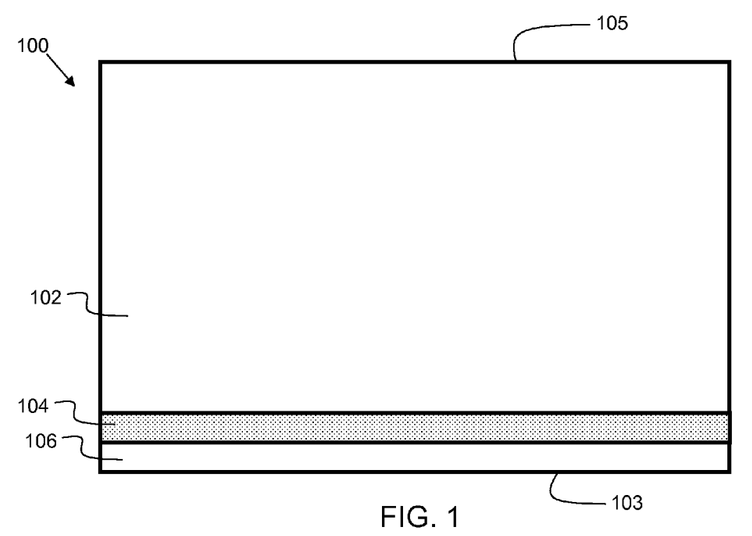
FIG. 1 is a semiconductor structure at a starting point for embodiments of the present invention.

FIG. 1 is a semiconductor structure 100 at a starting point for embodiments of the present invention. Semiconductor structure 100 comprises a bulk semiconductor substrate 102. In embodiments, substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. An insulator layer 104 is disposed on the semiconductor substrate 102. In embodiments, insulator layer 104 may be comprised of silicon oxide, and may be referred to as a buried oxide (BOX) layer. A semiconductor-on-insulator (SOI) layer 106 is disposed on the insulator layer 104. In embodiments, the SOI layer 106 may be comprised of the same material as the bulk substrate. As shown in FIG. 1, the structure 100 is inverted (upside down) such that the front side 103 is at the bottom, and the back side 105 is at the top. In embodiments, the structure 100 may be inverted as shown, in order to begin formation of the dummy DTs on the back side 105. However, it will be recognized that some processing tools may be able to perform such functions without the need to invert the structure. Hence, some embodiments of the present invention may perform such operations in a non-inverted orientation.

Figure 2:
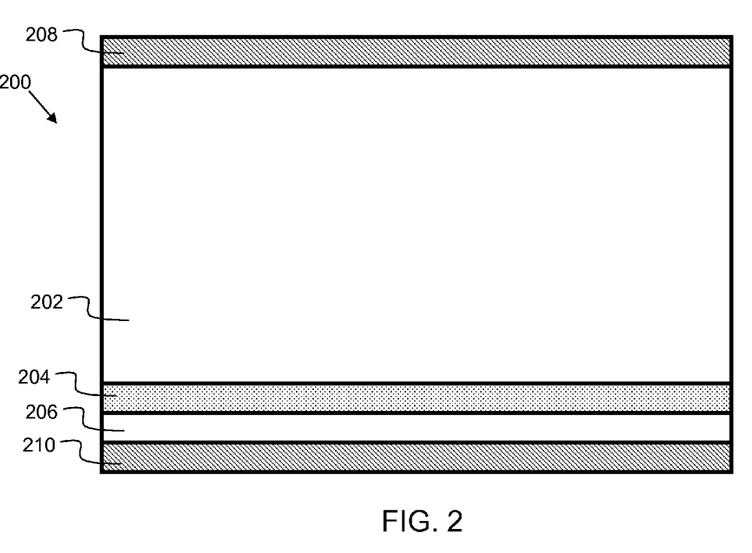
FIG. 2 is a semiconductor structure after a subsequent process step of depositing a pad layer in accordance with embodiments of the present invention.

FIG. 2 is a semiconductor structure 200 after a subsequent process step of depositing a pad layer 208 and 210 in accordance with embodiments of the present invention. As stated previously, similar elements may be referred to by similar numbers in various figures (FIGs) of the drawing, in which case typically the last two significant digits may be the same. For example, bulk substrate 202 of FIG. 2 is similar to bulk substrate 102 of FIG. 1. In embodiments, pad layer 208 and 210 may be comprised of silicon nitride.

Figure 3:
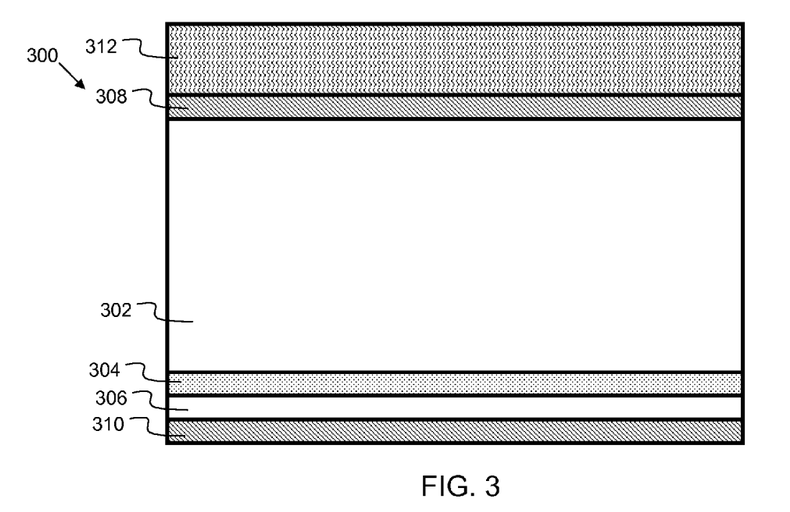
FIG. 3 is a semiconductor structure after a subsequent process step of depositing a hardmask layer on the back side of the semiconductor structure in accordance with embodiments of the present invention.

FIG. 3 is a semiconductor structure 300 after a subsequent process step of depositing hardmask layer 312 on the back side of the semiconductor structure in accordance with embodiments of the present invention. In embodiments, the hardmask layer 312 may be comprised of silicon oxide or other suitable material. In embodiments, the hardmask layer 312 is deposited using a chemical vapor deposition (CVD) process.

Figure 4:
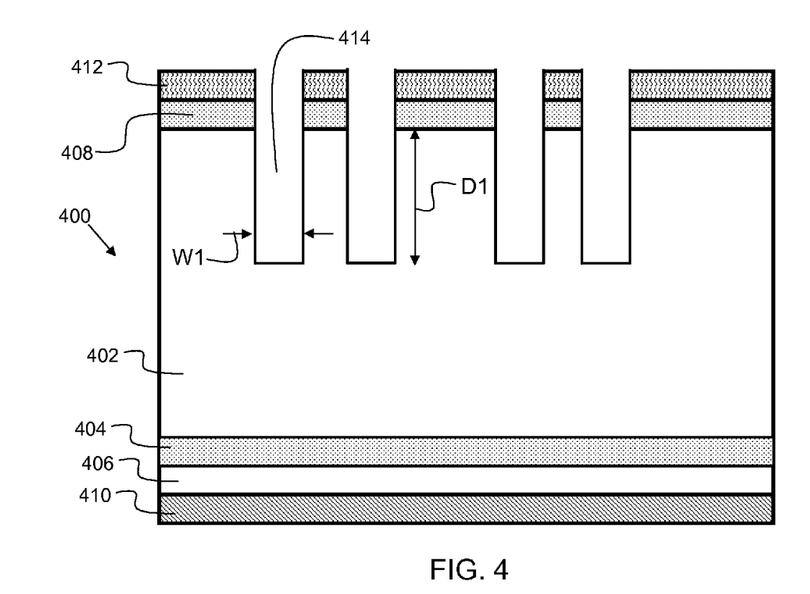
FIG. 4 is a semiconductor structure after a subsequent process step of forming back side deep trench cavities in accordance with embodiments of the present invention.

FIG. 4 is a semiconductor structure 400 after a subsequent process step of recessing the hardmask layer 412, and then forming back side deep trench cavities 414 in accordance with embodiments of the present invention. Cavities 414 may be formed using an anisotropic etch process such as a reactive ion etch (RIE) process. In embodiments, the cavities 414 may have a depth D1 ranging from about 3 microns to about 4 microns, and a width W1 ranging from about 40 nanometers to about 120 nanometers.

Figure 5:
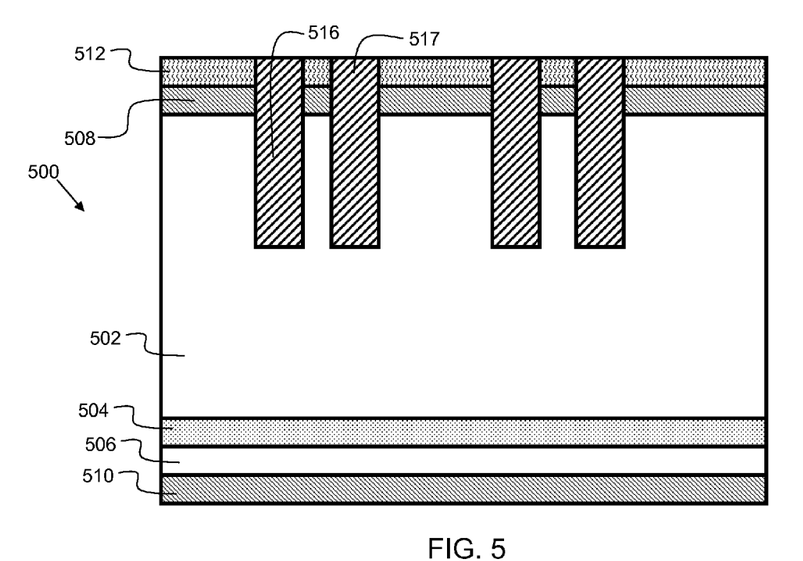
FIG. 5 is a semiconductor structure after a subsequent process step of filling the back side deep trench cavities in accordance with embodiments of the present invention.

FIG. 5 is a semiconductor structure 500 after a subsequent process step of filling the back side deep trench cavities in accordance with embodiments of the present invention. A fill material 517 is deposited in each deep trench 516. In embodiments, the fill material 517 may comprise tungsten or other suitable material.

Figure 6:
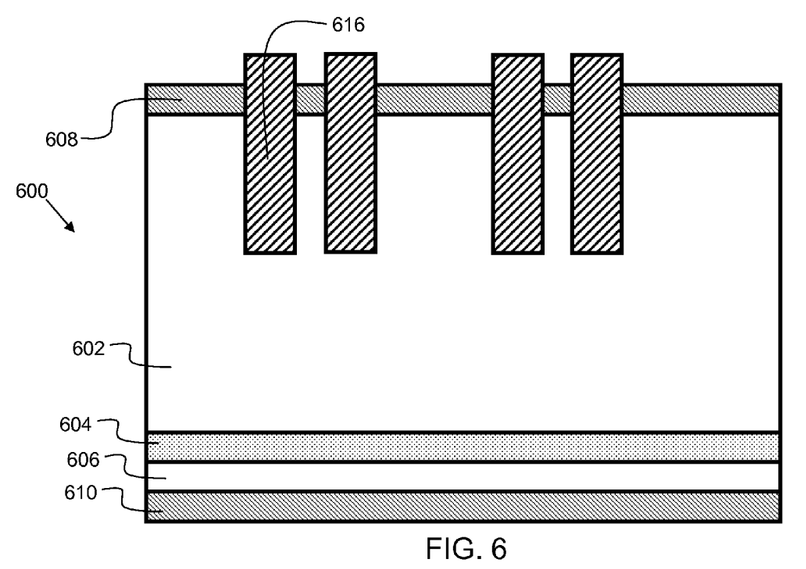
FIG. 6 is a semiconductor structure after a subsequent process step of removing the hardmask layer in accordance with embodiments of the present invention.

FIG. 6 is a semiconductor structure 600 after a subsequent process step of removing the hardmask layer in accordance with embodiments of the present invention (compare with 512 of FIG. 5).

Figure 7:
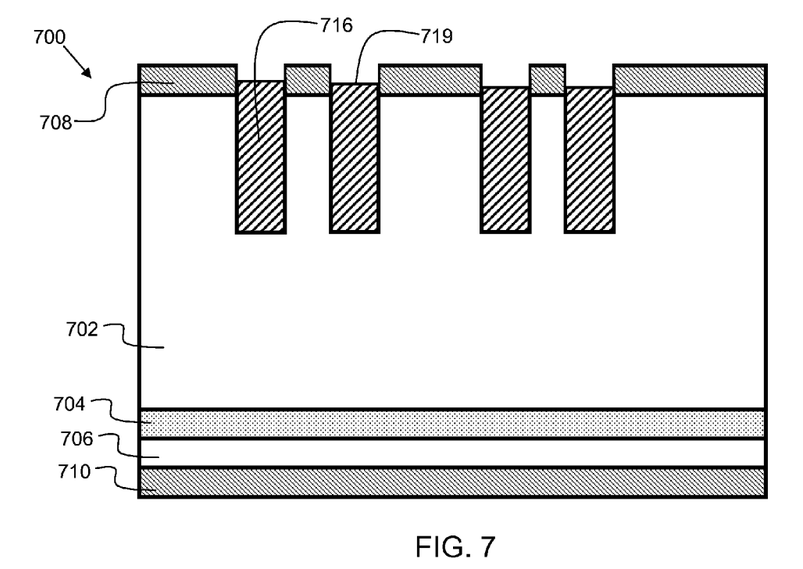
FIG. 7 is a semiconductor structure after a subsequent process step of recessing the back side deep trenches in accordance with embodiments of the present invention.

FIG. 7 is a semiconductor structure 700 after a subsequent process step of recessing the back side deep trenches 716 in accordance with embodiments of the present invention. In embodiments, as a result of the recess, the top 719 of trenches 716 is at a level in between the pad layer 708.

Figure 8:
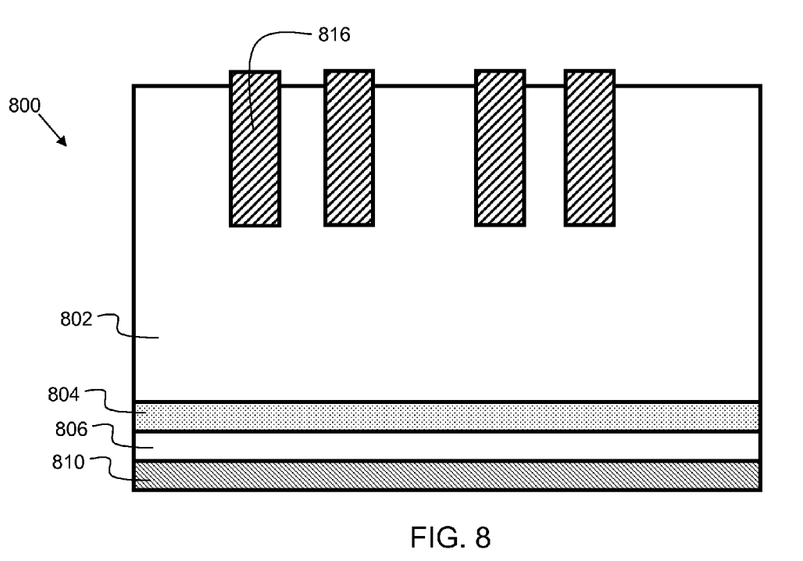
FIG. 8 is a semiconductor structure after a subsequent process step of removing the back side pad layer in accordance with embodiments of the present invention.

FIG. 8 is a semiconductor structure 800 after a subsequent process step of removing the back side pad layer (compare with 708 of FIG. 7) in accordance with embodiments of the present invention.

Figure 9:
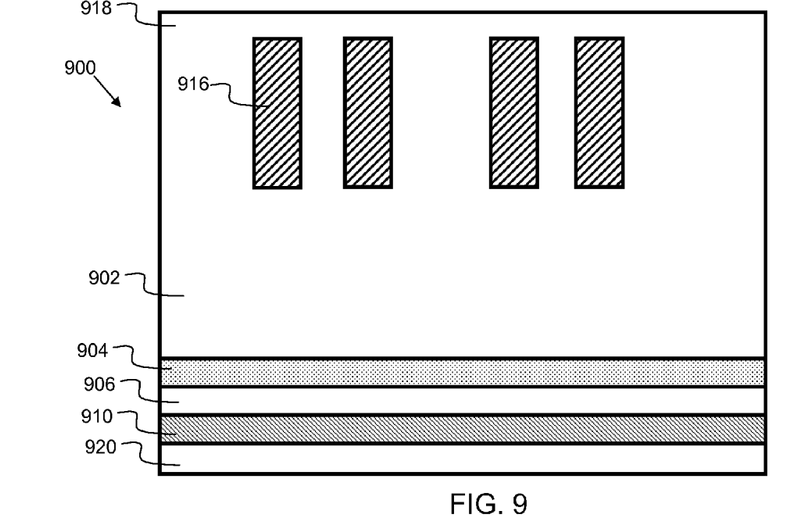
FIG. 9 is a semiconductor structure after a subsequent process step of depositing a layer of polysilicon over the back side deep trenches in accordance with embodiments of the present invention.

FIG. 9 is a semiconductor structure 900 after a subsequent process step of depositing a layer of polysilicon 918 over the back side deep trenches in accordance with embodiments of the present invention. This serves to encapsulate the back side deep trenches 916 such that they are completely covered and not exposed. During this process, a polysilicon layer 920 may also be formed on the front side of the semiconductor structure.

Figure 10:
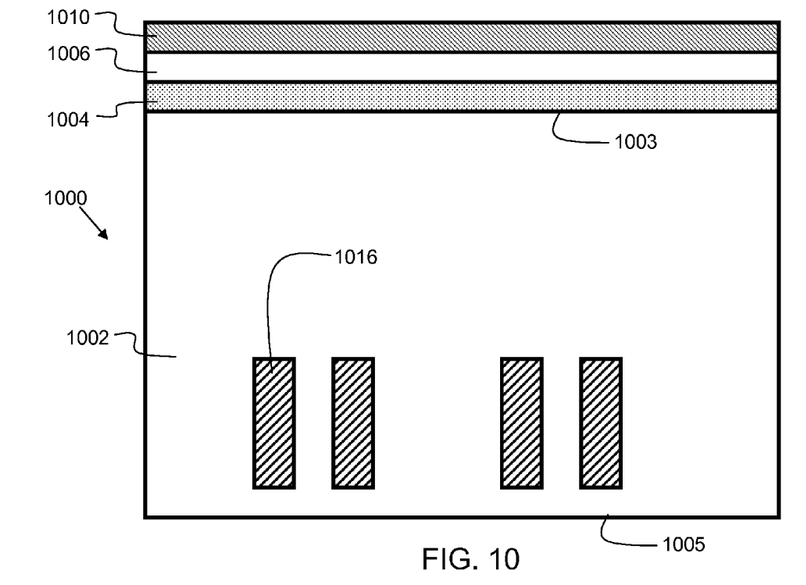
FIG. 10 is a semiconductor structure after a subsequent process step of removing the polysilicon from the front surface of the semiconductor substrate in accordance with embodiments of the present invention.

FIG. 10 is a semiconductor structure 1000 after a subsequent process step of removing the polysilicon from the front surface of the semiconductor substrate in accordance with embodiments of the present invention. As shown in FIG. 10, semiconductor structure 1000 is reverted to a traditional orientation in which front side 1003 of substrate 1002 is at the top of the structure, while back side 1005 of the wafer is at the bottom. Additionally, the topmost layer of silicon is removed to expose the pad layer 1010.

Figure 11:
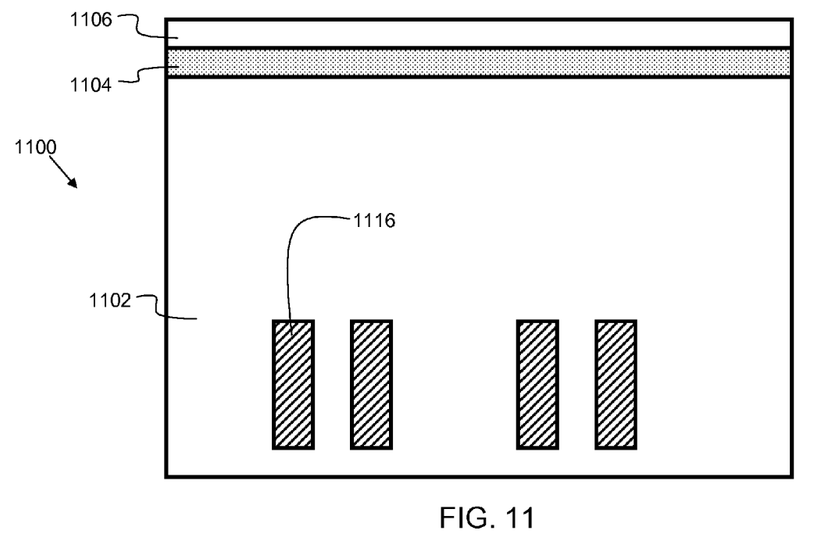
FIG. 11 is a semiconductor structure after a subsequent process step of removing the front side pad layer in accordance with embodiments of the present invention.

FIG. 11 is a semiconductor structure 1100 after a subsequent process step of removing the front side pad layer (compare with 1010 of FIG. 10) in accordance with embodiments of the present invention.

Figure 12:
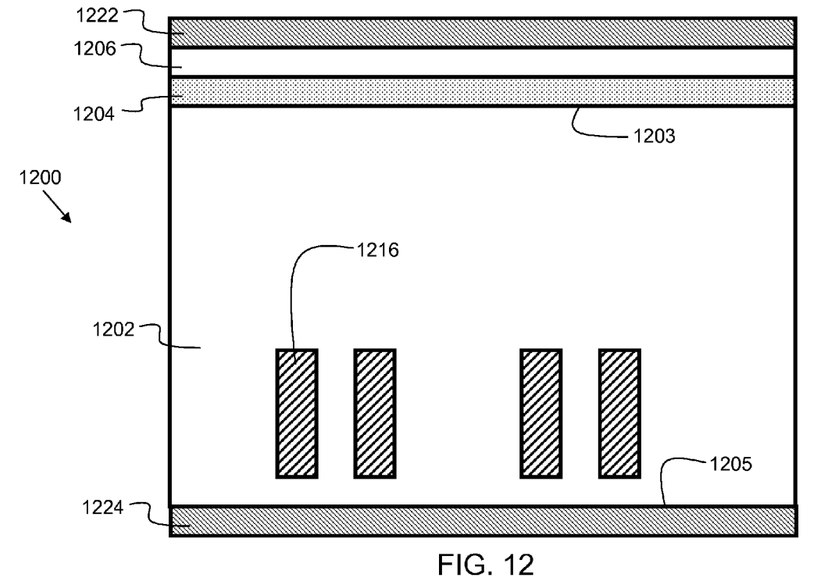
FIG. 12 is a semiconductor structure after a subsequent process step of depositing a new pad layer on the front and back sides of the semiconductor substrate in accordance with embodiments of the present invention.

FIG. 12 is a semiconductor structure 1200 after a subsequent process step of depositing a new pad layer on the front and back sides of the semiconductor substrate in accordance with embodiments of the present invention. Pad layer 1222 is formed over the front side of the semiconductor substrate 1202, and pad layer 1224 is formed under the back side 1205 of the semiconductor substrate 1202. In embodiments, pad layers 1222 and 1224 are comprised of silicon nitride.

Figure 13:
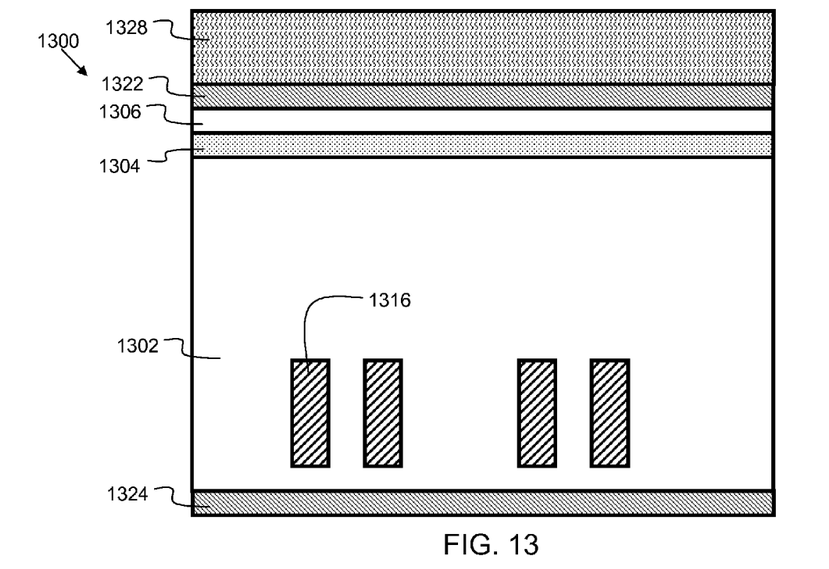
FIG. 13 is a semiconductor structure after a subsequent process step of depositing hardmask layer on the front side of the semiconductor structure in accordance with embodiments of the present invention.

FIG. 13 is a semiconductor structure 1300 after a subsequent process step of depositing hardmask layer 1328 on the front side of the semiconductor structure in accordance with embodiments of the present invention. In embodiments, hardmask layer 1328 is comprised of silicon oxide. In embodiments, the hardmask layer 1328 is deposited using a chemical vapor deposition process.

Figure 14:
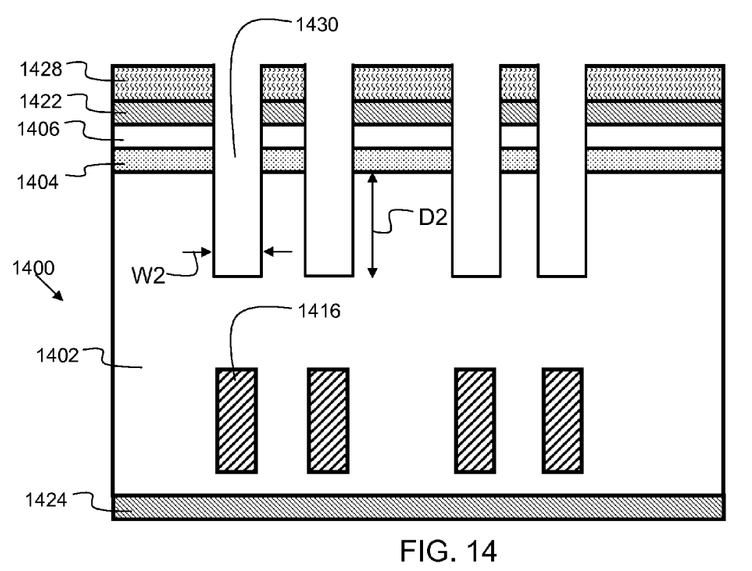
FIG. 14 is a semiconductor structure after a subsequent process step of forming front side deep trench cavities in accordance with embodiments of the present invention.

FIG. 14 is a semiconductor structure 1400 after a subsequent process step of recessing the hardmask layer 1428, and then forming front side deep trench cavities 1430 in accordance with embodiments of the present invention. In embodiments, the cavities 1430 may have a depth D2 ranging from about 3 microns to about 4 microns, and a width W2 ranging from about 80 nanometers to about 100 nanometers. In embodiments, the front side deep trench cavities 1430 have a similar dimension and placement has back side deep trenches 1416.

Figure 15:
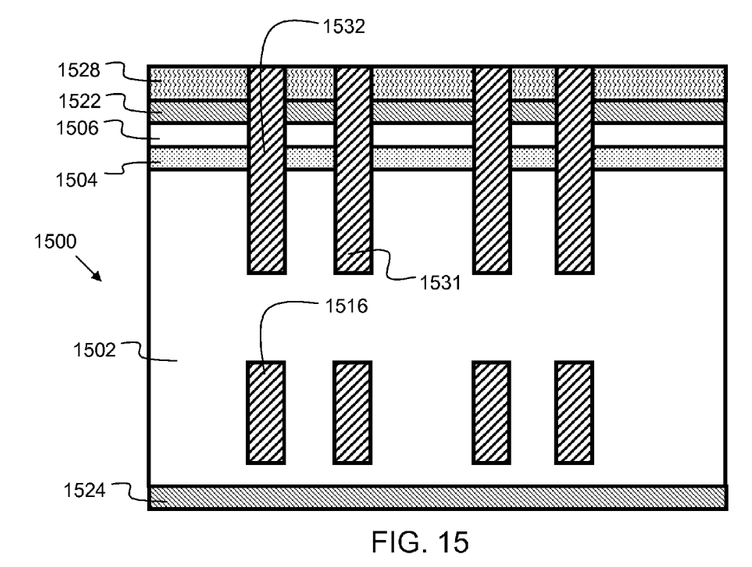
FIG. 15 is a semiconductor structure after a subsequent process step of filling the front side deep trench cavities in accordance with embodiments of the present invention.

FIG. 15 is a semiconductor structure after a subsequent process step of filling the front side deep trench cavities in accordance with embodiments of the present invention. A fill material 1531 is deposited in each deep trench 1532. In embodiments, the fill material 1531 may comprise tungsten or other suitable material.

Figure 16:
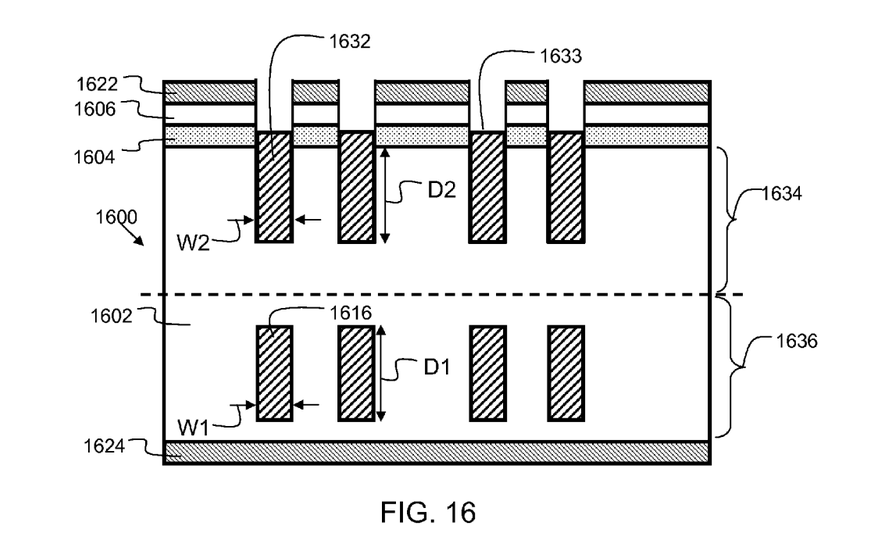
FIG. 16 is a semiconductor structure after a subsequent process step of recessing the front side deep trenches in accordance with embodiments of the present invention.

FIG. 16 is a semiconductor structure 1600 after a subsequent process step of recessing the front side deep trenches 1632 in accordance with embodiments of the present invention. In embodiments, as a result of the recess, the top 1633 of trenches 1632 is at a level in between the insulator layer 1604.

The surface area of each trench is a function of its depth and width. The back side deep trenches 1616 are disposed in a lower region 1636 of substrate 1602. The back side deep trenches 1616 are confined to the lower region 1636, and do not extend into the upper region 1634. The front side deep trenches 1633 are disposed in an upper region 1634 of substrate 1602. The front side deep trenches 1633 do not extend into the lower region 1636. Ideally, the combined surface area of all the back side deep trenches is equivalent to the combined surface area of all the front side deep trenches. The surface area of the deep trenches affects the amount of tensile or compressive stress exerted on the substrate. Hence, by forming and maintaining deep trenches in the lower region 1636, equal forces are exerted in the upper region 1634 and lower region 1636. The equal forces serve to reduce warping of the substrate, thereby reducing overlay and topography issues.

Figure 17:
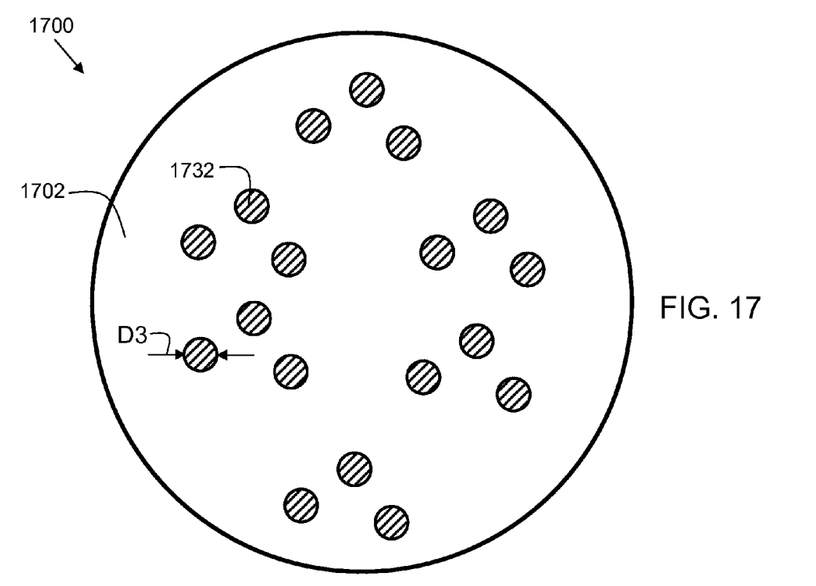
FIG. 17 is a top-down view of an embodiment of the present invention.

FIG. 17 is a top-down view of semiconductor structure 1700 in accordance with an embodiment of the present invention. Semiconductor structure 1700 comprises wafer 1702 which comprises a plurality of front side deep trenches 1732. While a few deep trenches are illustrated in FIG. 17, in practice, the wafer 1702 may comprise hundreds of die, each with many thousands of deep trenches contained therein. In embodiments, the deep trenches 1732 are cylindrical, and have diameter D3. In embodiments, diameter D3 may range from about 80 nanometers to about 100 nanometers.

Figure 18:
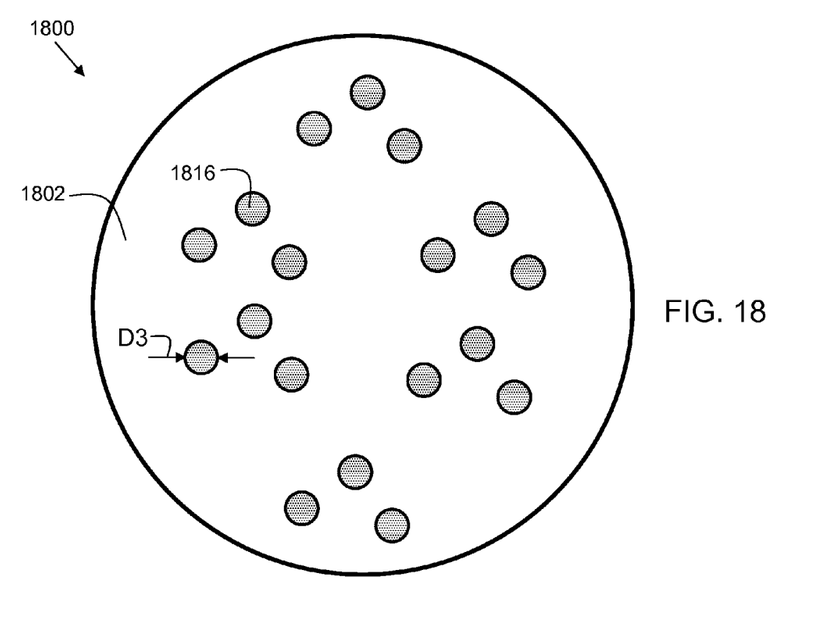
FIG. 18 is a bottom-up view of an embodiment of the present invention.

FIG. 18 is a bottom-up view of a semiconductor structure 1800 in accordance with an embodiment of the present invention. Semiconductor structure 1800 comprises wafer 1802 which comprises a plurality of back side deep trenches 1816 which mirror the plurality of front side deep trenches 1732 shown in FIG. 17. In embodiments, the back side deep trenches 1816 are similar in size, number, and position to the front side deep trenches 1732 shown in FIG. 17. Hence, back side deep trenches 1816 also have diameter D3. The identical size, number, and positioning causes equal forces on both the front and back sides of the wafer, which serves to prevent warping which can lead to overlay errors or topography problems.

Figure 19:
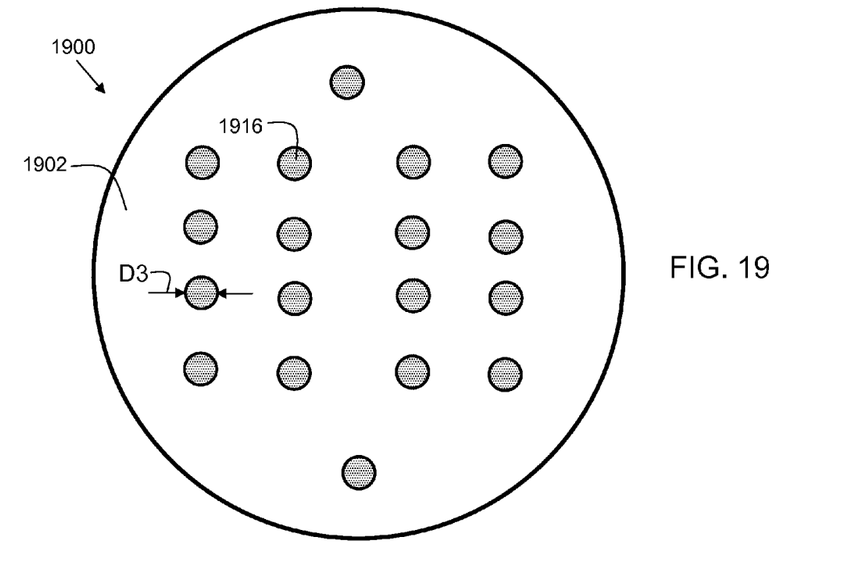
FIG. 19 is a bottom-up view of an alternative embodiment of the present invention.

FIG. 19 is a bottom-up view of a semiconductor structure 1900 in accordance with an alternative embodiment of the present invention. With semiconductor structure 1900, the back side deep trenches 1916 are similar in number to the front side deep trenches 1732 of FIG. 17, and also have diameter D3 equal to that of the front side deep trenches. However, the deep trenches 1916 are formed in a pattern to approximate the surface area of the functional deep trench pattern on the front side. Therefore, this embodiment does not utilize a minor pattern, but rather uses an approximate equivalent surface area (AESA) to approximate the surface area of the front side deep trenches. For example, assuming cylindrical deep trenches, each deep trench has a surface area (sidewalls and bottom) of:

$$2(\pi)((D3)/2*D1)+\pi((D3)/2)^2$$

The total surface area of the back side deep trenches is then:

$$Tb(2(\pi)((D3)/2*D1)+\pi((D3)/2)^2)$$

Where Tb is the total number of back side deep trenches, D1 is the depth of a back side deep trench, and D3 is the diameter of a back side deep trench. Similarly, the total surface area of the front side deep trenches is then:

$$Tf(2(\pi)((D3)/2*D2)+\pi((D3)/2)^2)$$

Where Tf is the total number of front side deep trenches, D2 is the depth of a front side deep trench, and D3 is the diameter of a front side deep trench.

If the back side total surface area is similar to that of the front side total surface area, substrate warping may be reduced. Thus, ideally, the surface area of the front and back side deep trenches is equivalent such that:

$$Tf(2(\pi)((D3)/2*D2)+\pi((D3)/2)^2)=\pi(2(\pi)((D3)/2*D1)+\pi((D3)/2)^2)$$

Hence, even though this embodiment does not mirror the front side deep trenches in terms of position, it provides an approximation that may be advantageous in certain circumstances by providing a reduced fabrication complexity. In some embodiments, the back side deep trenches 1916 are of the same dimensions and number as the front side deep trenches 1732 of FIG. 17, but with a different pattern.

Figure 20:
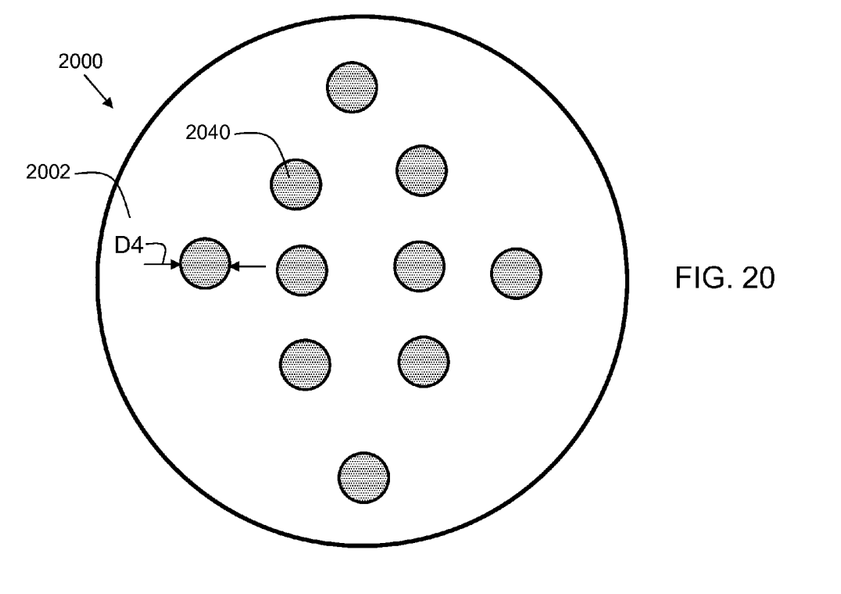
FIG. 20 is a bottom-up view of another alternative embodiment of the present invention.

FIG. 20 is a bottom-up view of a semiconductor structure 2000 in accordance with another alternative embodiment of the present invention. In this embodiment, the back side deep trenches 2040 have a diameter D4, which is greater than diameter D3 of the front side deep trenches (FIG. 17). In embodiments, diameter D4 ranges from about 120 nanometers to about 200 nanometers. Using the approximation of total surface area as described previously, fewer deep trenches of a larger size may be used on the back side of the substrate to approximate the stresses induced by the front side deep trenches. The larger size of the backside deep trenches allows fewer trenches to be used to achieve the same approximate surface area as the greater number of front side deep trenches. Since the back side deep trenches are not functional, but serve a mechanical purpose, there is more flexibility in their size and placement as compared with front side deep trenches.

Figure 21:
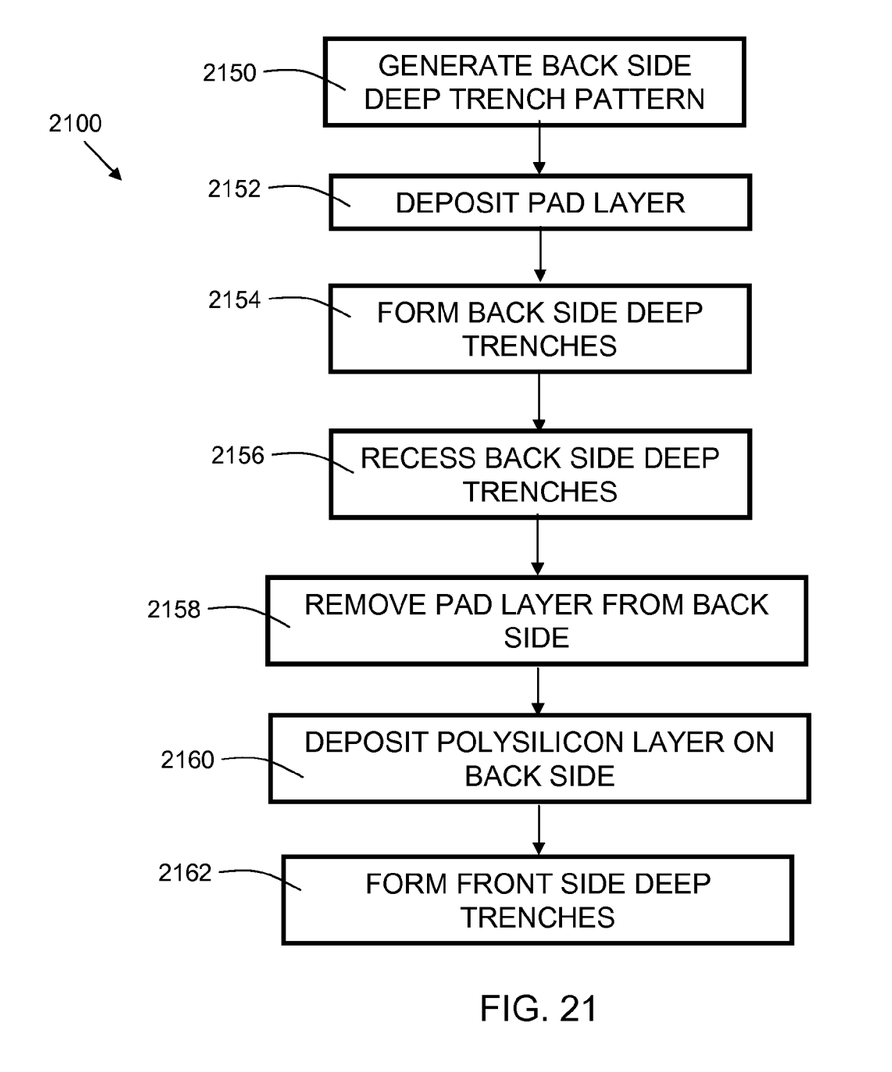
FIG. 21 is a flowchart indicating process steps for embodiments of the present invention.

FIG. 21 is a flowchart 2100 indicating process steps for embodiments of the present invention. In process step 2150, a back side deep trench pattern is generated. This pattern may be a minor pattern, or may be a different pattern. The back side deep trench pattern may utilize deep trenches of a similar size to the front side deep trenches, or may utilize deep trenches that are smaller or larger than the front side deep trenches. In process step 2152, a pad layer is deposited. In embodiments, the pad layer is comprised of silicon nitride. In process step 2154, back side deep trenches are formed. This may comprise performing a deep reactive ion etch (RIE) to form trench cavities, followed by one or more deposition and planarization steps to fill and planarize the trench cavities. The planarization may include a chemical mechanical polish (CMP) process. In process step 2156, the back side deep trenches are recessed. In process step 2158, the pad layer is removed from the back side of the substrate. In process step 2160, a polysilicon layer is deposited on the back side. This serves to encapsulate the back side trenches. In process step 2162, front side deep trenches are formed. From this point forward, industry standard techniques may be used to complete fabrication of the integrated circuit (IC). In some embodiments, the back side deep trenches may be removed from the final integrated circuit by a back side thinning process or planarization process, such as a chemical mechanical polish (CMP) process. In other embodiments, the back side deep trenches may remain on the final integrated circuit.

Design tools can be provided and configured to create the datasets used to pattern the deep trenches as described herein. For example, data sets can be created to generate photomasks used during lithography operations to pattern the layers for structures as described herein. The data may reside in a computer readable medium in a data format used for the exchange of layout data of integrated circuits (e.g. information stored in a GDSII (GDS2), GL1, OASIS, or any other suitable format for storing such design structures). Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device having one or more processors configured to execute instructions stored in a non-transitory computer readable medium in order to generate a back side deep trench pattern. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:
    depositing a pad layer to a front side and a back side of a semiconductor substrate;
    forming a plurality of back side deep trenches on the back side of the semiconductor substrate to form a back side deep trench pattern;
    recessing the plurality of back side deep trenches;
    removing the pad layer from the back side of the semiconductor substrate;
    depositing a polysilicon layer on the back side of the semiconductor substrate and covering the plurality of back side deep trenches; and
    forming a plurality of front side deep trenches on the front side of the semiconductor substrate to form a front side deep trench pattern, wherein the front side deep trench pattern is a minor of the back side deep trench pattern.

2. The method of claim 1, wherein depositing a pad layer comprises depositing silicon nitride.

3. The method of claim 1, wherein depositing a hardmask layer comprises depositing silicon oxide.

4. The method of claim 1, wherein forming a plurality of back side deep trenches comprises:
    performing a deep reactive ion etch on the back side of the semiconductor substrate to form a plurality of deep trench cavities; and
    depositing a fill material in each deep trench cavity of the plurality of deep trench cavities.

5. The method of claim 4, further comprising planarizing the fill material.

6. The method of claim 5, wherein the planarizing is performed with a chemical mechanical polish process.

7. The method of claim 4, wherein depositing a fill material comprises depositing tungsten.

* * * * *